(12) United States Patent
Song

(10) Patent No.: US 8,508,395 B2
(45) Date of Patent: Aug. 13, 2013

(54) TIME VARYING QUANTIZATION-BASED LINEARITY ENHANCEMENT OF SIGNAL CONVERTERS AND MIXED-SIGNAL SYSTEMS

(75) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 52 days.

(21) Appl. No.: 13/182,260

(22) Filed: Jul. 13, 2011

(65) Prior Publication Data

US 2012/0013494 A1  Jan. 19, 2012

Related U.S. Application Data

(60) Provisional application No. 61/365,561, filed on Jul. 19, 2010.

(51) Int. Cl.
*H03M 1/20* (2006.01)

(52) U.S. Cl.
USPC ........... 341/131; 341/138; 341/140; 341/142; 341/143

(58) Field of Classification Search
USPC .......................... 341/131, 138–140, 142, 143
See application file for complete search history.

(56) References Cited

U.S. PATENT DOCUMENTS

| | | | | |
|---|---|---|---|---|
| 4,914,439 A * | 4/1990 | Nakahashi et al. | ........... | 341/131 |
| 4,937,576 A * | 6/1990 | Yoshio et al. | .................. | 341/131 |
| 5,265,039 A * | 11/1993 | Curbelo et al. | ................ | 356/319 |
| 5,357,257 A * | 10/1994 | Nevin | ........................... | 342/165 |
| 5,493,298 A * | 2/1996 | Bartz | ............................. | 341/131 |
| 5,525,984 A * | 6/1996 | Bunker | ......................... | 341/131 |
| 5,963,157 A * | 10/1999 | Smith | ............................ | 341/131 |
| 6,016,113 A * | 1/2000 | Binder | .......................... | 341/131 |
| 6,639,537 B1 * | 10/2003 | Raz | ................................ | 341/155 |
| 6,653,959 B1 * | 11/2003 | Song | ............................. | 341/131 |
| 6,667,706 B2 * | 12/2003 | Jones | ........................... | 341/156 |
| 6,894,630 B1 * | 5/2005 | Massie et al. | ................. | 341/118 |

(Continued)

FOREIGN PATENT DOCUMENTS

| | | |
|---|---|---|
| EP | 2128991 A2 | 12/2009 |
| JP | 2009-246655 A | 10/2009 |
| KR | 10-2007-0081199 A | 8/2007 |

OTHER PUBLICATIONS

International Search Report and Written Opinion in counterpart international application No. PCT/US2011/043877, dated Feb. 28, 2012; 9 pages.

(Continued)

*Primary Examiner* — Linh Nguyen
(74) *Attorney, Agent, or Firm* — Guerin & Rodriguez, LLP; Michael A. Rodriguez

(57) ABSTRACT

A signal-linearization system and method reduces nonlinear distortions in a digitized signal generated by an analog-to-digital converter (ADC) when converting an analog input signal from analog to digital form. A signal adder adds a dither waveform to the analog input signal. An ADC includes sample-and-hold (S/H) circuitry and quantizer circuitry. The ADC converts the analog input signal with the added dither waveform into a digitized signal. The dither waveform operates to suppress nonlinear distortions attributed to the quantizer circuitry. A linearizer processor performs nonlinear equalization (NLEQ) on the digitized signal to suppress nonlinear distortions attributed to the S/H circuitry. A dither waveform removal module removes a digital counterpart of the dither waveform from the digitized signal.

35 Claims, 12 Drawing Sheets

(56) References Cited

U.S. PATENT DOCUMENTS

| | | | |
|---|---|---|---|
| 7,224,299 B2* | 5/2007 | Somayajula | 341/131 |
| 2006/0164276 A1* | 7/2006 | Luh | 341/155 |
| 2008/0198914 A1 | 8/2008 | Song | |
| 2008/0205667 A1* | 8/2008 | Bharitkar et al. | 381/103 |

OTHER PUBLICATIONS

Brannon, Brad, Overcoming Converter Nonlinearities with Dither, Application Note, 1995, pp. 1-8, AN-410, Analog Devices, Massachusetts.

Kester, Walt, ADC Input Noise: The Good, The Bad, and the Ugly. Is No Noise Good Noise?, Magazine, Feb. 2006, pp. 1-5, vol. 40, Analog Dialogue.

Roy, Batruni et al., Digitally Assisted Analog: Reducing Design Constraints Using Nonlinear Digital Signal Processing, Paper, Nov. 2005, pp. 1-6, Optichron.

Atmel Corporation, Dithering in Analog-to-digital Conversion, Application Note, Jul. 2007, pp. 1-12, e2v semiconductors.

C. J. Kikkert, et al. Hardware Additive Dither for Analogue to Digital Converters, Proc. IREE 14th Australian Microelectronics conf. Sep. 29-Oct. 1, 1997, pp. 156-161, Melbourne Vic. Australia.

Wang, Tunde et al., A Level-Crossing Analog-to-Digital Converter With Triangular Dither, Article, Sep. 2009, pp. 2089-2099, vol. 56, No. 9, IEEE TCAS.

Texas Instruments Inc., 16-Bit, 170/200-MSPS Analog-To-Digital Converters, Data Sheet, Oct. 2009, pp. 1-37, Dallas.

* cited by examiner

TIME VARYING QUANTIZATION-BASED LINEARITY ENHANCEMENT OF SIGNAL CONVERTERS AND MIXED-SIGNAL SYSTEMS

RELATED APPLICATION

This application claims priority to and the benefit of U.S. provisional application No. 61/365,561, filed on Jul. 19, 2010, titled "Time Varying Quantization Based Linearity Enhancement of Analog-to-Digital Converters and Mixed-Signal Systems," the entirety of which provisional application is incorporated by reference herein.

GOVERNMENT RIGHTS IN THE INVENTION

This invention was made with government support under grant number FA8721-05-C-0002 awarded by the Air Force. The government has certain rights in this invention.

FIELD OF THE INVENTION

The invention relates generally to signal-linearization systems. More specifically, the invention relates to ADCs (Analog-to-Digital Converters), DACs (Digital-to-Analog Converters), and mixed-signal systems adapted to remove nonlinear distortions introduced to an input signal during conversion of the input signal between analog and digital forms.

BACKGROUND

Linearity is becoming increasingly important in mixed-signal systems such as radio frequency (RF) communications, radar, Electronic Warfare (EW), Signal Intelligence (SIGINT), and sensor systems. Driving the need for high linearity is the increasing use of digital beamforming phased array and frequency channelized configurations. FIG. 1 shows an example of a digital beamforming receiver system 10 having a plurality of receive channels. Each receive channel includes an antenna 12 (or group of antennas called a sub-array), an RF receiver 14, and an ADC (Analog-to-Digital Converter) 16. The RF receiver 14 of a given channel converts incoming RF signals to an intermediate frequency (IF). The ADC 16 samples the IF and produces an ADC channel output 18. A digital beamformer 20 receives the ADC channel outputs 18 from the multiple channels and computes a digital beam 22 by multiplying each channel by beamforming weights and computing sums.

In a single channel system, the RF receiver 14 and ADC 16 are generally designed such that the spurs and intermods 26 are below the noise level 24 at the channel output 18 of the ADC so that they do not interfere with detection of small signals (only intermods are shown in this output 18). However, in the digital beamforming system, the digital beamforming process enhances the signal-to-noise ratio (SNR) because the signals add coherently and noises add in power. The spurs and intermods 26 also tend to add coherently during the digital beamforming process because they tend to be highly correlated from channel to channel. Generally, the SNR gain is approximately $3 \log_2 N$ (dB), where N represents the number of channels being combined. Therefore, after digital beamforming, the spurs and intermod levels 26 can finish above the noise level 24' if many channels are combined to provide high SNR gain as shown in the digital beam 22. These spurs and intermods 26 can interfere with the small signal detection, thus demonstrating the importance of linearity processes in the phased array receivers that can attenuation such nonlinear distortions.

FIG. 2 shows an example of a frequency channelized receiver system 30, capable of achieving similar SNR gain to that of the digital beamforming system 10 of FIG. 1, and further illustrating the importance of linearity. The frequency channelized receiver system 30 includes an antenna 32, an RF receiver 34, an ADC 36, and a frequency channelizer 38. The RF receiver 34 converts incoming RF signals from the antenna 32 to an intermediate frequency (IF). The ADC 36 samples the IF and produces an ADC digitized output 40. The digitized output 40 has a two-tone input signal 42, an initial noise level 44, and spurs and intermods 46, which are lower in power than the noise level 44. To compute the sub-band in the digital frequency channelization process, the frequency channelizer 38 bandpass filters the wideband signal to produce narrowband signals (output 48). During the bandpass filtering process, the out-of-band noise is filtered out and only in-band noise 50 remains. Therefore, if the in-band noise is spread evenly across all frequencies, the overall noise power is reduced as shown in the "equivalent noise level" 52, and the SNR in the sub-band ends up higher than the initial full-band SNR. The SNR gain is approximately $3 \log_2 M$ (dB) where M is the number of sub-bands. Therefore, the in-band spurs and intermods 46 that were initially below the noise level 44 can finish above the noise level 52 after the digital channelization process. These spurs and intermods 46 can interfere with small signal detection.

Some communication and sensor systems have both digital beamforming and digital frequency channelization. In such systems, the SNR gain is equivalent to $3 \log_2 MN$ (dB). With such high SNR gain, even low level spurs and intermods can interfere with small signal detection, again illustrating the importance of linearizing the ADC response.

SUMMARY

In one aspect, the invention features a method of reducing nonlinear distortions in a digitized signal generated by an analog-to-digital converter (ADC) when converting an analog input signal from analog to digital form. The method comprises adding, to the analog input signal, a dither waveform adapted to suppress nonlinear distortions attributed quantizer circuitry of the ADC during conversion of the analog input signal into a digitized signal. Nonlinear equalization (NLEQ) is performed on the digitized signal to suppress nonlinear distortions attributed to sample-and-hold (S/H) circuitry of the ADC during the conversion of the analog input signal into the digitized signal. A digital counterpart of the dither waveform added to the analog input signal is removed from the digitized signal.

In another aspect, the invention features a signal-linearization system for reducing nonlinear distortions in a digitized signal generated by an analog-to-digital converter (ADC) when converting an analog input signal from analog to digital form. The system comprises a signal adder adding a dither waveform to the analog input signal and an ADC that includes sample-and-hold (S/H) circuitry and quantizer circuitry. The ADC converts the analog input signal with the added dither waveform into a digitized signal. The dither waveform operates to suppress nonlinear distortions attributed to the quantizer circuitry. A linearizer processor performs nonlinear equalization (NLEQ) on the digitized signal to suppress nonlinear distortions attributed to the S/H circuitry. A dither waveform removal module removes a digital counterpart of the dither waveform from the digitized signal.

In still another aspect, the invention features a signal-linearization system for reducing nonlinear distortions in a digitized signal generated by an analog-to-digital converter (ADC) when converting an analog input signal from analog to digital form. The system comprises means for providing an analog input signal to each ADC of a plurality of ADCs operating in parallel, and a plurality of analog signal adders. Each signal adder is in communication with one of the ADCs. Each signal adder combines a dither waveform to the analog input signal provided to the ADC with which that signal adder is in communication. Each dither waveform added to one of the analog input signals is adapted to suppress nonlinear distortions attributed to quantizer circuitry of the ADC receiving that analog input signal. A digital signal adder receives and combines the intermediate digitized signals produced by the plurality of ADCs to produce a digitized signal.

In yet another aspect, the invention features a signal-linearization system for reducing nonlinear distortions in an output signal generated by a signal converter device when converting an input signal between analog and digital forms. The system comprises a signal adder adding a dither waveform to the input signal, and a signal converter device converting the input signal with the added dither waveform from one of the analog and digital forms into an output signal having the other of the analog and digital forms. The dither waveform is adapted to suppress nonlinear distortions by being substantially uncorrelated with the input signal and by having a signal level that is approximately equal to or greater than a maximum signal level of the input signal, a frequency spectrum that is substantially uniformly distributed within a predetermined frequency range, a peak-to-average ratio that is approximately equal to the square root of two, and a distribution of quantization levels that is substantially balanced. A dither waveform removal module removes the dither waveform from the output signal.

In still yet another aspect, the invention features a signal-linearization system for reducing nonlinear distortions in an analog output signal by a digital-to-analog converter (DAC) when converting a digital input signal from digital to analog form. The system comprises a waveform generator producing a digital dither waveform, a digital signal adder adding the digital dither waveform to the digital input signal, and a DAC converting the digital input signal with the added dither waveform into an analog output signal. The dither waveform operates to suppress nonlinear distortions attributed to circuitry of the DAC. A dither waveform removal module is in communication with the DAC to receive the analog output signal. The dither waveform removal module removes from the analog output signal an analog counterpart of the digital dither waveform and produces a linearized analog output signal.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

To prevent spurs and intermods from interfering with small signal detection, the linearity of an input signal needs enhancing to reduce spur and intermod levels. For this purpose, a nonlinear equalization (NLEQ) technique has been developed, an example implementation of which is described in U.S. application Ser. No. 12/030,913, filed Feb. 14, 2008, the entirety of which is incorporated by reference herein. The NLEQ technique can digitally model the nonlinearities in RF receivers and ADCs and subtract them from the digitized ADC output to suppress the spur and intermod levels in the presence of high level input signals. Experimental results with many ADCs, however, reveal that NLEQ techniques have theirs limitations; although NLEQ techniques can be highly effective in modeling nonlinearities of RF circuit components, such as linear amplifiers, their performance can be somewhat limited when applied to linearizing ADCs.

Signal-linearization mechanisms described herein can extend the linearity of ADCs, DACs, and mixed-signal systems by orders of magnitude higher than can be accomplished with currently available NLEQ technologies. By utilizing a time varying quantization or dither technique, the highly complex nonlinearities of ADCs can be reduced so that NLEQ techniques can improve linearity. Preliminary experimental results show improvements as great as two orders of magnitude higher spur-free dynamic range (SFDR) and intermod-free dynamic range (IFDR) than conventional NLEQ techniques. Such signal-linearization mechanisms can enhance the dynamic range of various types of systems including, but not limited to, communication systems, radar systems, electronic warfare (EW) systems, and signal intelligence (SIGINT) systems.

Figure 1:
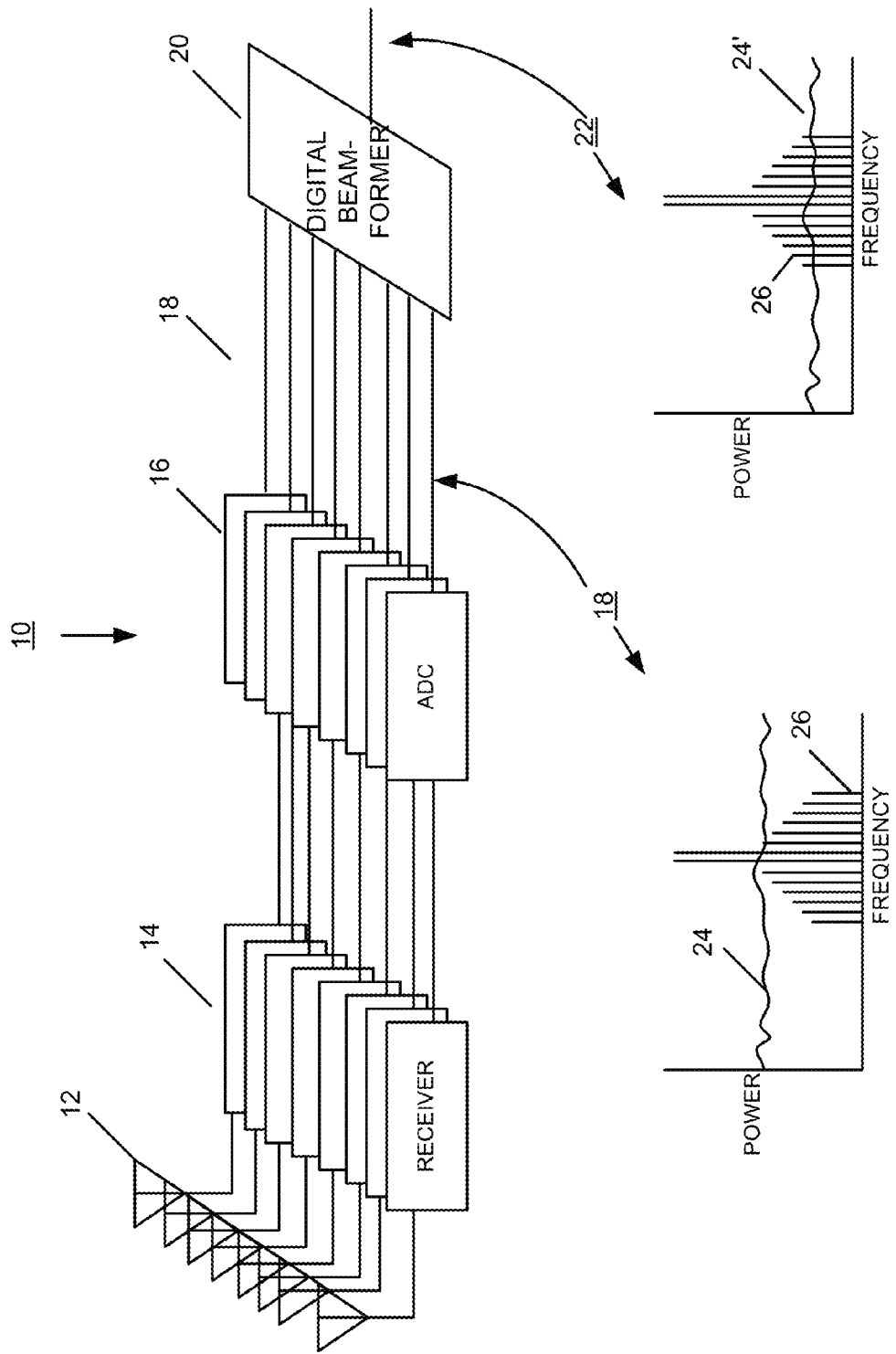
FIG. 1 is a block diagram of an example of a beamforming receiver system.
Figure 2:
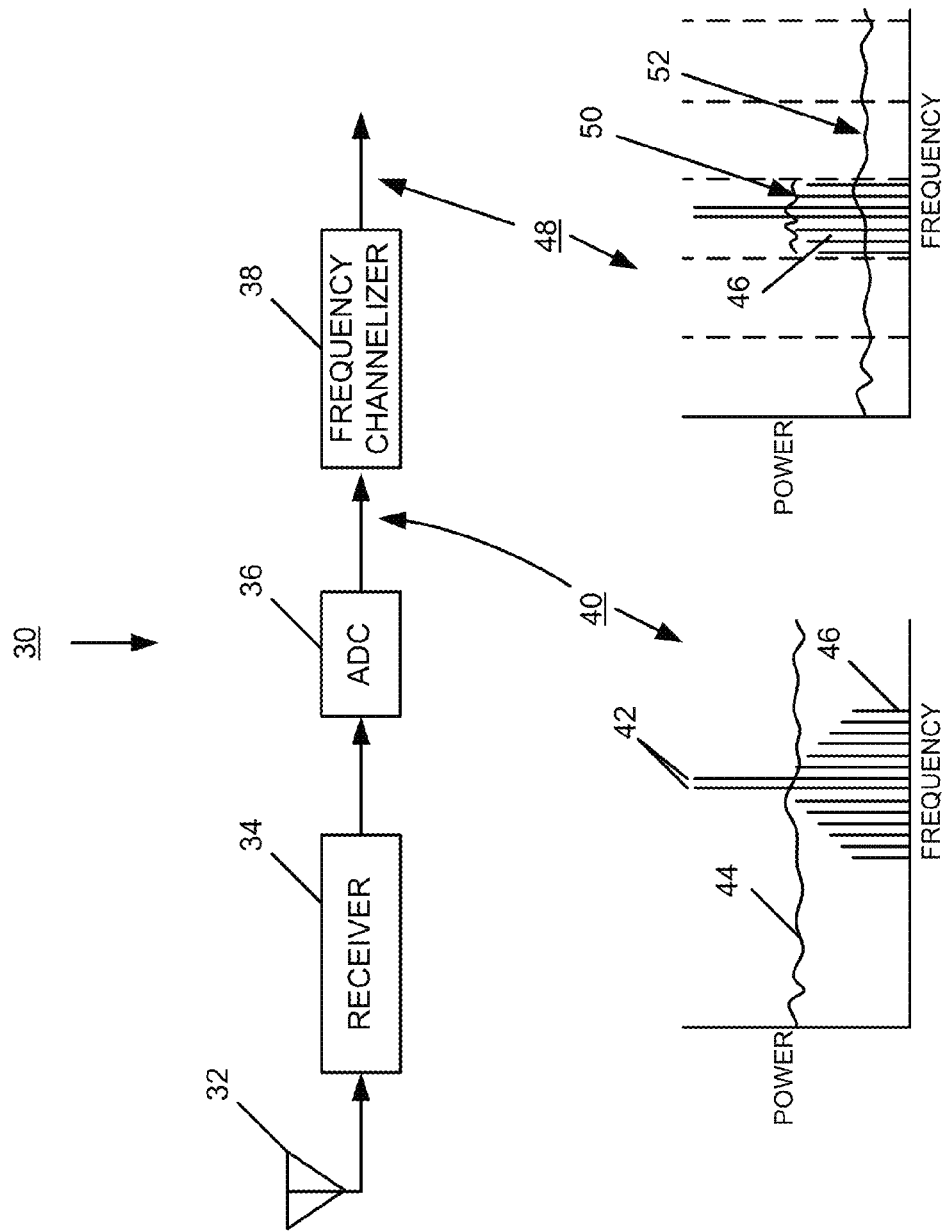
FIG. 2 is a block diagram of an example of a frequency channelizer receiver system.
Figure 3:
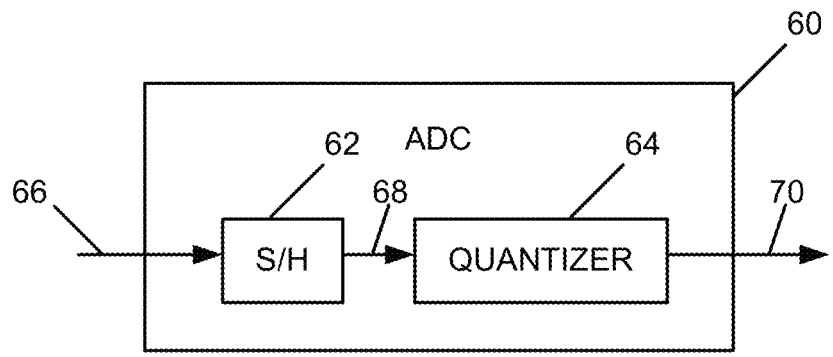
FIG. 3 is a block diagram of a simplified example of an ADC.

FIG. 3 shows a simplified example of an ADC 60 for which the signal-linearization mechanisms described herein may be used. The ADC 60 comprises sample-and-hold (S/H) circuitry 62 in communication with quantizer circuitry 64. The S/H circuitry 62 receives an analog input signal 66, and samples and "freezes" (i.e., holds) the input signal in time. The S/H circuitry 62 can include buffer amplifiers disposed before and after the sample-and-hold circuit responsible for freezing the input signal. The quantizer circuitry 64 converts the frozen input signal 68 to digital levels and produces digitized output data 70.

In general, NLEQ (nonlinear equalization) techniques can effectively linearize the S/H circuitry 62 and any preceding buffer amplifier because the nonlinearities of the S/H circuits generally fit the NLEQ models (for example, a low-order polynomial-based nonlinearity model). In many ADCs, when the input signal levels are high, near saturation levels, the high-level spurs and intermods in the ADC response tend to be dominated by those spurs generated by the S/H circuitry 62. Such spurs, too, can be equalized well using existing NLEQ models.

Notwithstanding, the nonlinearities of the quantizer circuitry 64 tend to be more complex than those produced by the S/H circuitry 62, and current NLEQ techniques generally do not model them well because there are many high-order spurs and intermods. (In some ADCs, there may also be some spurs and intermods resulting from the feedback from the digital output side of the ADC. Hereafter, for purposes of this detailed description, quantizer-generated spurs and intermods are deemed to include those spurs and intermods resulting from digital feedback because of the difficulty separating the two sources of spurs and intermods from observations. This digital feedback can be supplied to any portion of the ADC, including but not limited to, the S/H input, the S/H circuitry, the S/H output, buffer, and quantizer circuitry.) The achievable amount of linearity improvement on quantizer nonlinearities thus tends to be limited. Although NLEQ techniques typically reduce S/H-generated spur/intermods to a similar level as the quantizer-generated spur/intermod level, which is generally lower than the maximum S/H-generated spur/intermod level in most ADCs, further linearity improvements have been difficult to come by.

Figure 4:
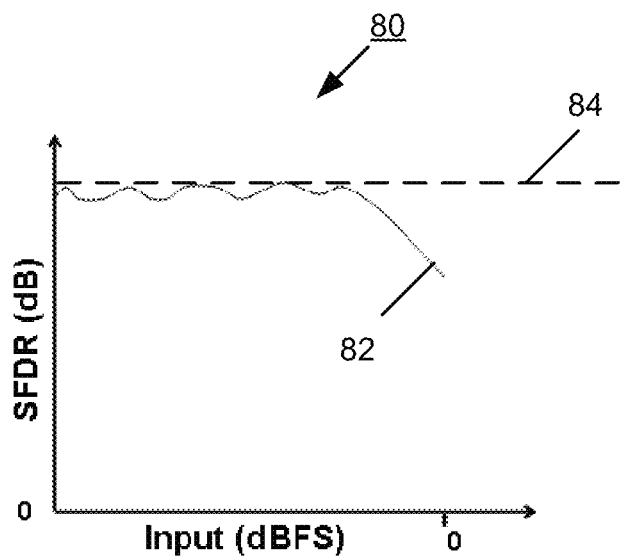
FIG. 4 is a graph showing the dependence of a spur-free dynamic range on the voltage level of the input signal.

Another characteristic of ADC nonlinearity is that the ADC spur and intermod levels do not decrease beyond a certain point despite further reductions of the analog input signal levels. FIG. 4 shows a graph 80 illustrating the dependence of the spur-free dynamic range (SFDR) 82 of a typical ADC on the level of the input signal. As the level of the input signal decreases from the full scale (0 dBFS), the SFDR 82 increases, but only up to a certain point 84. After that point, further lowering of the input signal level does not result in any appreciable increase in the SFDR. A reason for this observation is that the quantizer spur and intermod levels typically do not depend on the level of the input signal. As the input signal level is lowered, spurs generated by the S/H circuitry 62 are reduced, but the level of quantizer spurs and intermods remain effectively unchanged. Therefore, after the level of spurs and intermods generated by the S/H circuitry 62 decreases to the level of the quantizer spurs and intermods, no further appreciable improvement of the ADC SFDR is observed. In contrast, the SFDR for RF circuitry, such as an RF amplifier, typically keeps increasing as the input signal level decreases because the RF circuitry does not have a quantizer circuit that generates additional spurs and intermods.

To reduce the spur and intermod levels associated with ADCs, it is thus important to reduce both the S/H-generated spurs and intermods and quantizer-generated spurs and intermods. Mixed-signal systems and ADCs described herein vary the quantization level of the ADC with time so that the quantizer spurs and intermods average out over time. After the levels of quantizer-generated high-order spurs and intermods are reduced by such averaging, NLEQ techniques are used to attenuate the remaining S/H-generated low-order spurs and intermods. This combined approach prevents quantizer-generated spurs and intermods from limiting the gain in the spur-free dynamic range achieved by the NLEQ technique. Because NLEQ models, such as low-order polynomial-based models, model the low-order S/H-generated spurs and intermods well, relatively large linearity improvements are attainable after the high-order quantizer spurs and intermods are reduced.

Figure 5:
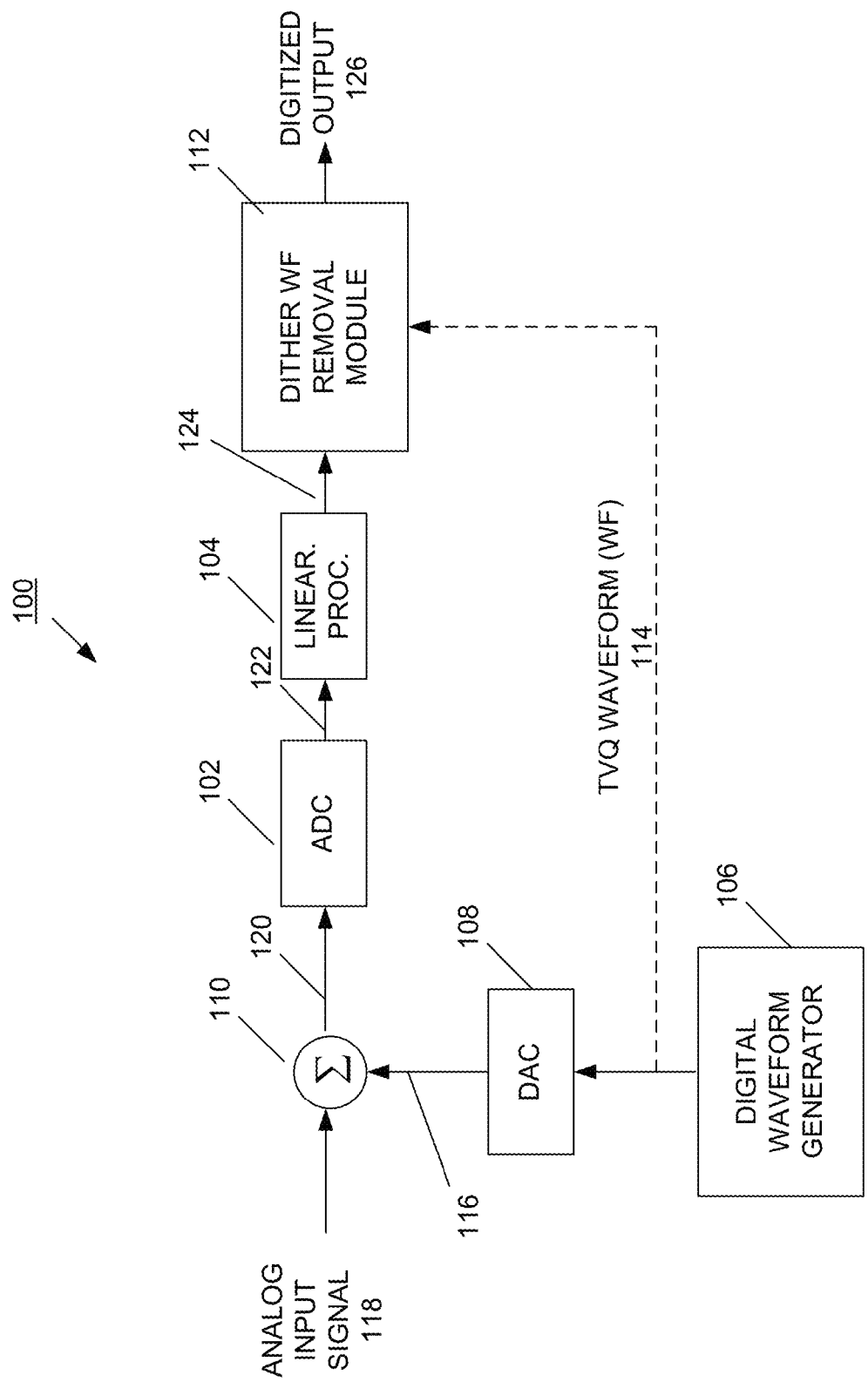
FIG. 5 is a block diagram of an embodiment of an ADC linearization system adapted to attenuate nonlinearities in the digital signal produced by the ADC.

FIG. 5 shows an embodiment of a signal-linearization system 100 including an ADC 102, a linearizer processor 104, a digital waveform generator 106 in communication with a DAC (digital-to-analog signal converter) 108, a signal adder 110, and a time varying quantization (TVQ) waveform removal module 112. The waveform generator 106 produces a specialized, high-level, digital, TVQ waveform 114, also referred to herein as a dither waveform or just dither. A purpose of the TVQ waveform is to vary the quantization level with time so that the quantizer-generated high-order spurs and intermods are reduced by averaging out the nonlinearities over various quantization levels. The DAC 108 receives and converts the digital TVQ waveform 114 into an analog TVQ counterpart 116. The signal adder 110 receives the analog TVQ counterpart 116 from the DAC 108 and adds it to an incoming analog input signal 118 (i.e., the input signal of interest). The resulting analog input signal 120, having the dither, passes from the signal adder 110 to the ADC 102. The ADC 102 converts the analog input signal 120 with the dither into an intermediate digitized signal 122.

Although the TVQ waveform 114 can reduce quantizer-generated high-order spurs and intermods, the low-order spurs and intermods generated by S/H circuitry of the ADC and related circuitries, such as a buffer amplifier, also need reducing. Hence, the intermediate digitized signal 122 at the output of the ADC 102 has significantly reduced levels of quantizer-generated high-order spurs and intermods, whereas levels of low-order spurs and intermods produced by the S/H circuitry may be only somewhat reduced, if at all. These remaining levels of S/H-generated spurs and intermods also need reducing.

To reduce these S/H-generated spurs and intermods, and remaining quantizer spurs, linearizer processor 104 performs nonlinear equalization on the intermediate digitized signal 122, thereby producing a linearized digitized signal 124. The TVQ waveform removal module 112 is in communication with the linearizer processor 104, receiving therefrom the linearized digitized signal 124, and removing from the linearized digitized signal 124 the TVQ waveform 114. In one embodiment, the waveform generator 106 is in communication with the TVQ waveform removal module 112 to send thereto the TVQ waveform 114, for use by the TVQ waveform removal module 112 to subtract the TVQ waveform 114 from the linearized digitized signal 124. The resulting linearized digitized output 126 has both attenuated S/H-generated and quantizer-generated spurs and intermods. If the TVQ waveform 114 is inserted into the input signal after the S/H circuitry and before the quantizer circuitry, as described in connection with FIG. 11, the order of the linearizer processor 104 and TVQ waveform removal module 112 can be reversed (that is, the TVQ waveform 114 is removed from the intermediate digitized signal 122 before the linearizer processor 104 removes any S/H-generated nonlinear distortions).

To reduce quantizer-generated high-order spurs and intermods, the level of the TVQ waveform is preferably high, that is, the signal level is approximately equal to or greater than the maximum level of the analog input signal 118 and within a few dB (1 to 6 dB) from the saturation level of ADC 102. In general, the signal level of the TVQ waveform 114 is made as high as practically possible so that SFDR/IFDR is increased for analog input signals 118 of both high and low levels. Generally, the level of the TVQ waveform 114 is higher than conventional dither signals that have been used to reduce quantizer-generated high-order spurs and intermods. For instance, low level (tens of dB below full-scale of the ADC) white noise dither signals are sometimes used in multi-stage pipelined quantizer ADCs to reduce the effects of repeated static nonlinearity patterns associated with a multi-stage pipelined quantizer by making repetitive quantizer nonlinearities appear more random. Although such low-level dither can reduce quantizer-generated high-order spurs and intermods to some extent when input signal levels are relatively low, high input signal levels often make little difference in the resulting SFDR/IFDR.

Because introduction of a TVQ waveform with a high signal level reduces the useable dynamic range for input signals of interest, the TVQ waveform preferably has a low peak-to-average ratio to minimize the decrease on the overall ADC dynamic range. (The peak-to-average ratio preferably refers to a measurement of a waveform calculated from the peak amplitude of the waveform divided by the root-mean-square value of the waveform.) In contrast, conventional white noise dither often has high peak-to-average ratio, which is generally unsuitable because the dither signal greatly decreases the maximum useable input signal level without providing substantial quantization level variation.

In addition, the TVQ waveform preferably has a balanced distribution of levels over time, in order to provide a balanced distribution of quantization level shifts. This balanced distribution ensures that the quantization nonlinearities average out over wide range of quantization levels. A tradeoff associated with a TVQ waveform having a substantially balanced distribution is that the TVQ waveform may not have a low peak-to-average ratio. Accordingly, a less than equally balanced waveform may suffice, provided the TVQ waveform sufficiently suppresses quantizer spurs.

The combination of the TVQ waveform and the input signal can produce artifacts in the polynomial of the ADC response (e.g. single tone, two tones, three tones). Polynomial-attributed artifacts may appear throughout much of the bandwidth of the ADC response, and particularly near the output frequencies of interest (i.e., in-band). These artifact levels can be high when the polynomials are generated from the combined input during the NLEQ process. Thus, such polynomial-attributed artifacts can interfere with the effectiveness of the nonlinear equalization (NLEQ) technique that is applied to the ADC response, limiting the NLEQ's effective performance to the attenuation of lower orders intermods ($3^{rd}$ and $5^{th}$ orders for example). To minimize the polynomial-attributed spurs and intermods, the frequency spectrum of the TVQ waveform is preferably distributed uniformly over a frequency range in order.

Simulated results demonstrate that, for narrowband applications, the frequency spectrum of the TVQ waveform can be customized to avoid producing polynomial-attributed artifacts within a narrow bandwidth about the frequency of interest, thus enabling the NLEQ to attenuate higher order intermods (i.e., $7^{th}$ order) effectively within that narrow band. More specifically, the frequency spectrum occupied by a given TVQ waveform can depend upon the ADC response frequency of interest, with the frequency spectrum of the given TVQ waveform being chosen such as to produce within the ADC response a narrow band surrounding the frequency of interest that is substantially free of polynomial-attributed artifacts.

The TVQ waveform also preferably has a randomizing nature to provide randomized quantization level of incoming signals. The reason for such randomness is so that the TVQ waveform will have minimal correlated components with the input signal in order to minimize quantizer spurs and intermods. In some embodiments, a non-random deterministic waveform is used, provided the TVQ waveform does not have correlated components with the input signal.

One method of introducing the TVQ waveform to the analog input signal, and later removing it without affecting the input signal, is to use an out-of-band TVQ waveform; an out-of-band TVQ waveform does not affect the input signal and can be removed using a digital filter. In general, the frequency range of the TVQ waveform is preferably as wide as possible without encroaching on the in-band portion of the input signal. For example, for a wideband signal, the out-of-band TVQ waveform can occupy a relatively narrow portion of the ADC bandwidth so that most of the ADC bandwidth remains available for use by the input signal. Conversely, for narrowband input signals, an out-of-band TVQ waveform can occupy a wide portion of the ADC bandwidth. Preferably, for narrowband cases, the TVQ waveform is in the frequency band of the input signal so that polynomial-attributed artifacts of the TVQ waveform combined with the input signal do not appear in-band. To generate the TVQ waveforms with these properties, a variety of techniques are available.

Figure 6:
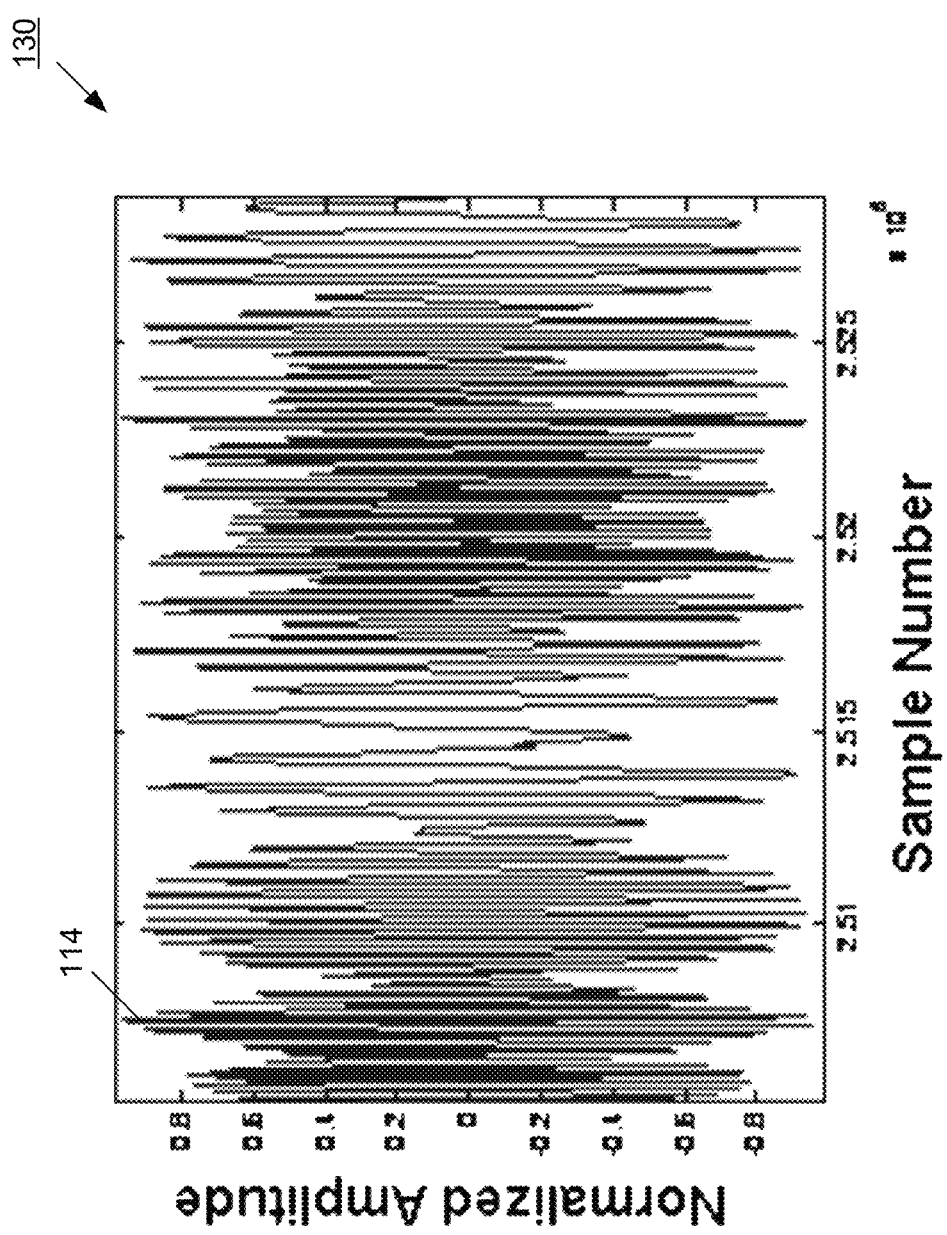
FIG. 6 is a graph of a time slice of an example of a time-varying quantization (TVQ) waveform injected into an input signal of interest.

FIG. 6 shows a graph 130 representing a time slice portion of an example of a low peak-to-average ratio TVQ waveform 114 with some of the aforementioned preferred characteristics. The x-axis represents the particular time slice (i.e., spanning sample numbers $2.50*10^6$ to $2.53*10^6$). The y-axis represents amplitude of the TVQ waveform 114 (for graphing purposes, the amplitude may be normalized, for example, to the maximum TVQ waveform value). This TVQ waveform is a band limited, randomized amplitude and phase modulated signal designed to have the preferred characteristics. The particular frequency modulation used here is a repeating up-down chirp with a random chirp rate. The amplitude modulation is a randomized non-sinusoidal modulation.

Figure 7:
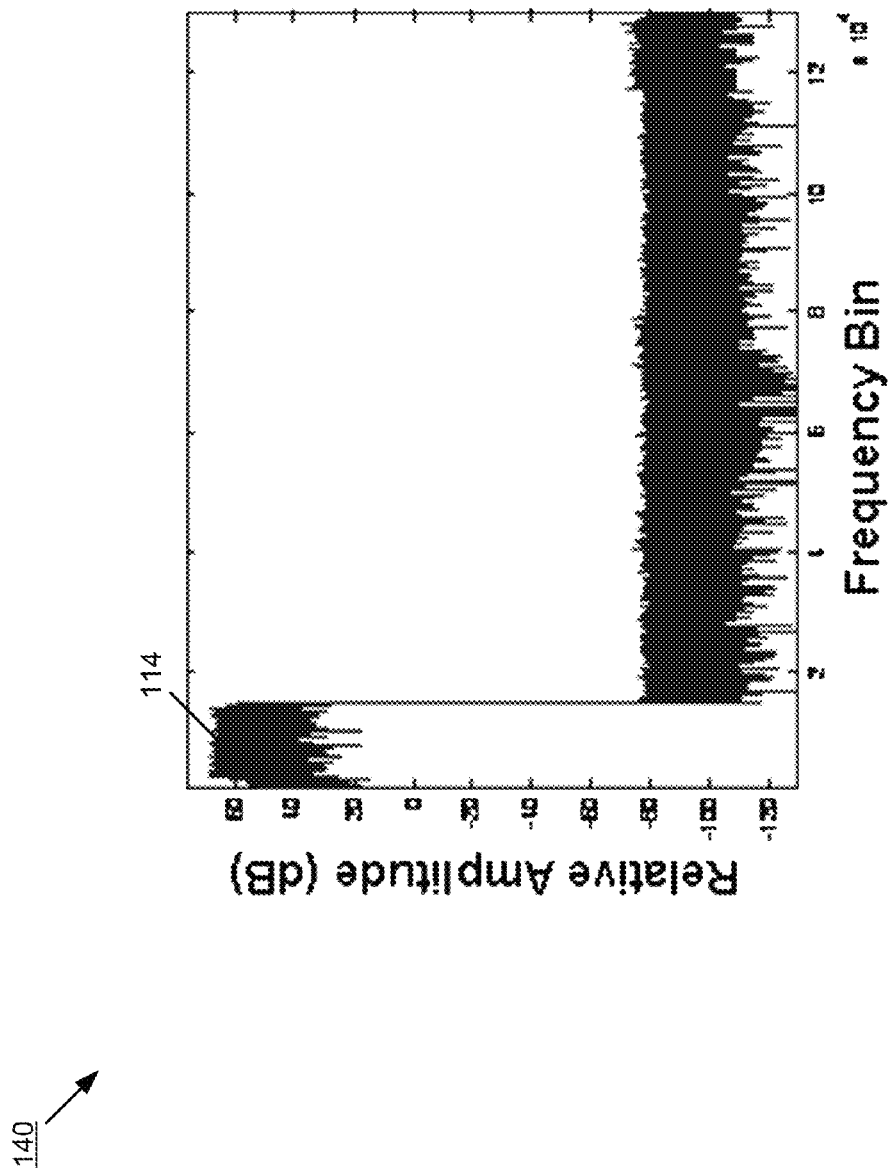
FIG. 7 is a frequency domain plot of the example TVQ waveform of FIG. 6.

FIG. 7 shows a frequency domain (FFT) plot 140 of the example TVQ waveform 114 of FIG. 6. The x-axis represents the relative amplitude or gain of the TVQ waveform. The y-axis represents the frequency spectrum of the TVQ waveform 114. The TVQ waveform has a relatively flat gain over the relatively narrowband portion of the frequency spectrum that the TVQ waveform occupies.

Figure 8:
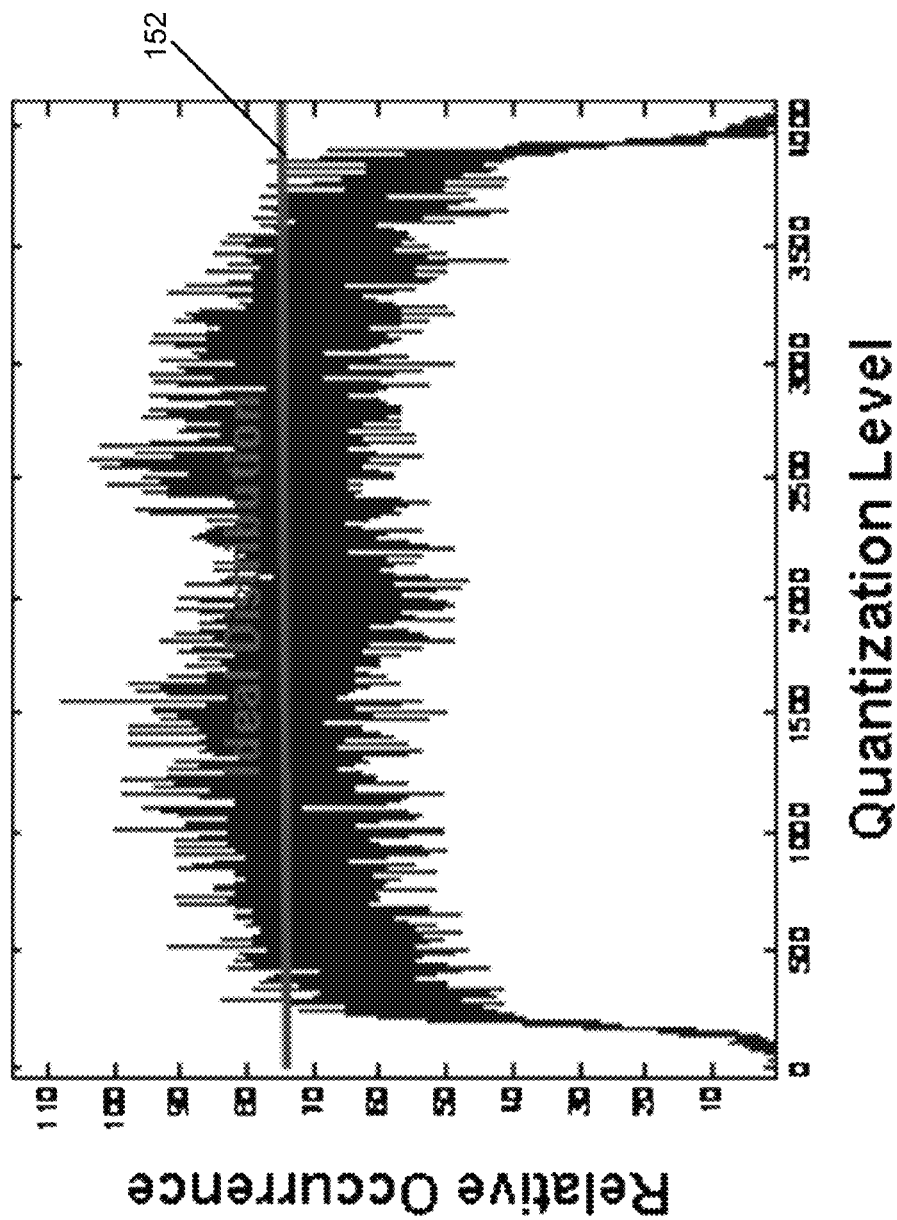
FIG. 8 is a histogram of the quantization levels of the example TVQ waveform of FIG. 6.

FIG. 8 shows a histogram 150 of the quantization levels of the example TVQ waveform 114 of FIG. 6. The x-axis represents the range of quantization levels. In this example, there are 4096 quantization levels (i.e., 12-bit ADC). The y-axis represents the relative occurrence of the different quantization levels. Although the distribution of quantization levels deviates from an ideal uniform distribution 152 at the upper and lower ends of the range of quantization levels, the TVQ waveform has an overall uniform distribution.

A variety of other TVQ waveforms can be generated to achieve some or most of the preferred characteristics. Such TVQ waveforms may include other band limited amplitude, frequency, and phase modulated versions of sinusoid, triangular, and other waveforms as well as linear or multiplicative combinations of those waveforms. Different TVQ waveforms can provide better performance for difference devices. In some cases amplitude modulation may not be required. In such cases, a frequency modulated up-down chirp may be sufficient for suppressing spurs and intermods. Such a randomly frequency-modulated up-down chirp may have a peak-to-average ratio near the square root of two, which is an ideal case.

Figures 9A, 9B:
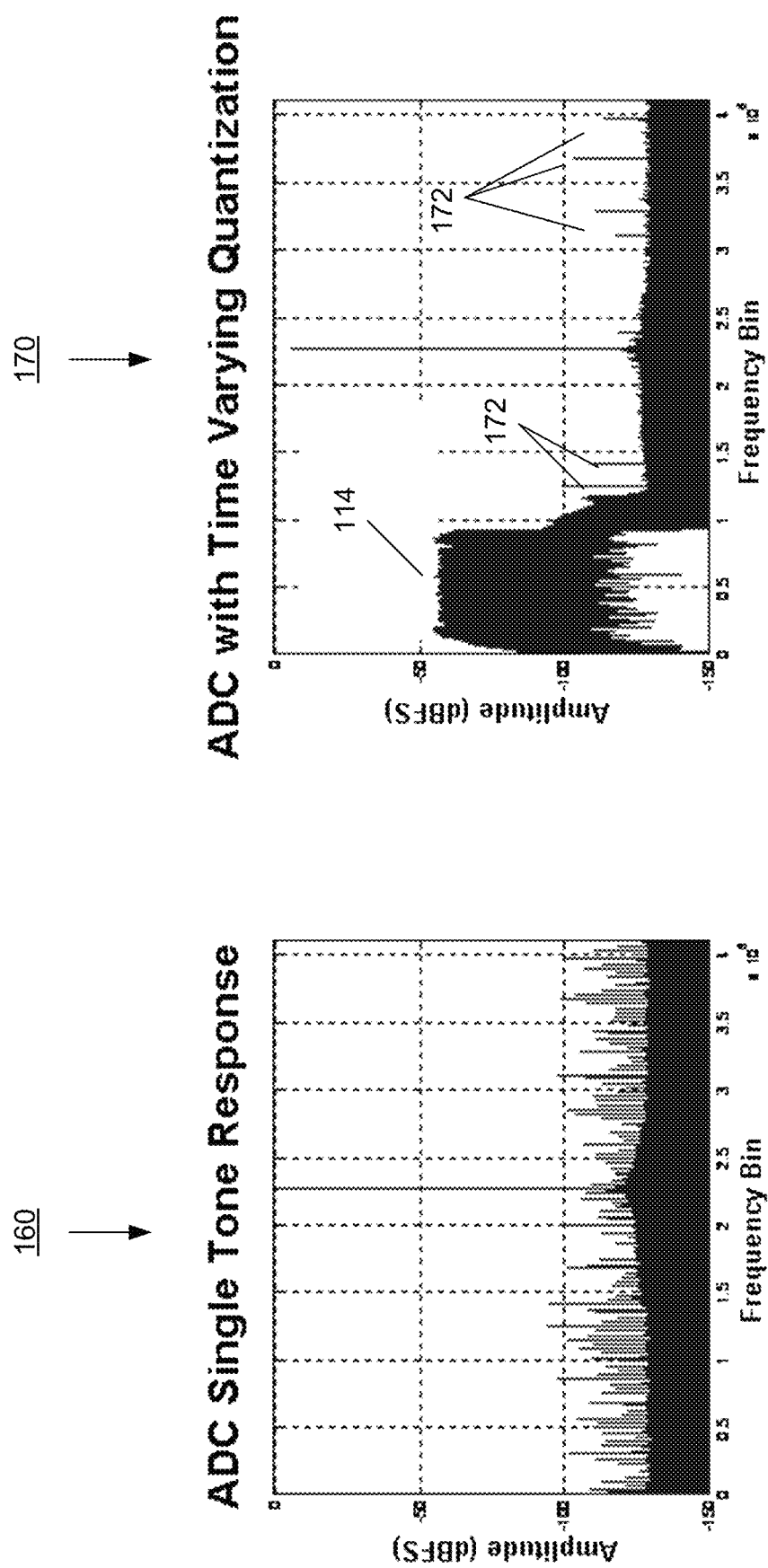
FIG. 9A and FIG. 9B are frequency plots of a digitized signal produced by an ADC before and after a TVQ waveform is injected into an analog input signal of interest.

FIG. 9A and FIG. 9B show experimental data gathered for a pipelined ADC, illustrating a reduction of quantizer-generated spurs and intermods through the use of a high-level TVQ waveform of the kind described herein. FIG. 9A shows a frequency plot 160 of a single tone response of the ADC with many high-order quantizer spurs. The x-axis represents the range of frequencies of the analog input signal without the TVQ waveform, and the y-axis represents the amplitude of the input signal. FIG. 9B shows a similar frequency plot 170 of the ADC response, in this instance with a TVQ waveform added to the analog input signal at the input of the ADC. In this example, the TVQ waveform 114 is outside of the frequency band of the analog input signal (out-of-band). As a result of injecting the TVQ waveform, the higher order ($7^{th}$ order) spurs are greatly attenuated. The remaining in-band spurs and intermods 172 are the lower order ($3^{rd}$ and $5^{th}$ orders) spurs that are probably generated by S/H circuitry of the ADC. The linearizer processor 104 (FIG. 5) can equalize these lower-order nonlinear distortions.

Figure 10B:
FIG. 10A and FIG. 10B are frequency plots before and after nonlinear equalization of spurs and intermods remaining in the digitized signal produced by an ADC from an analog input signal of interest.
Figure 10B:
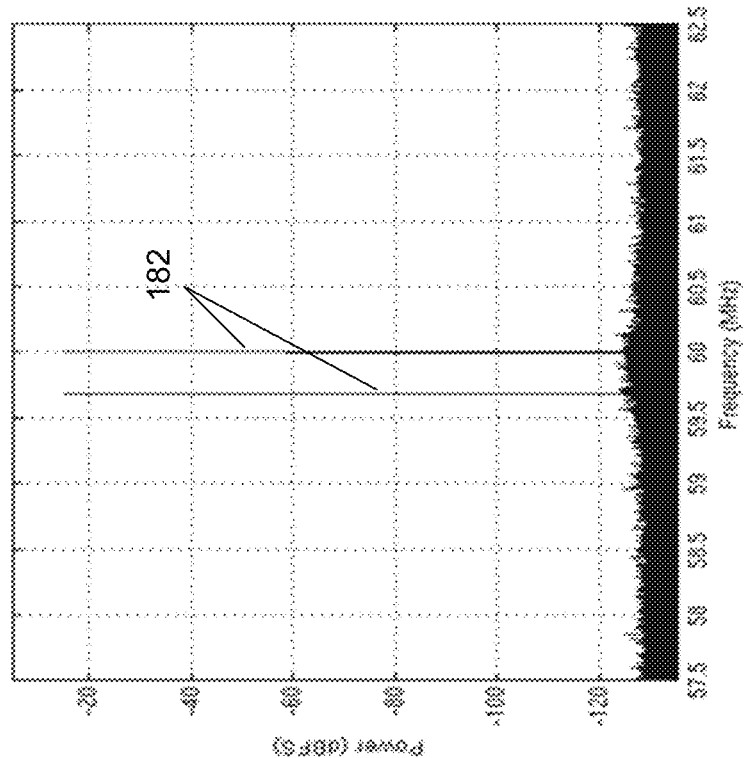
Figure 10A:
Figure 10A:
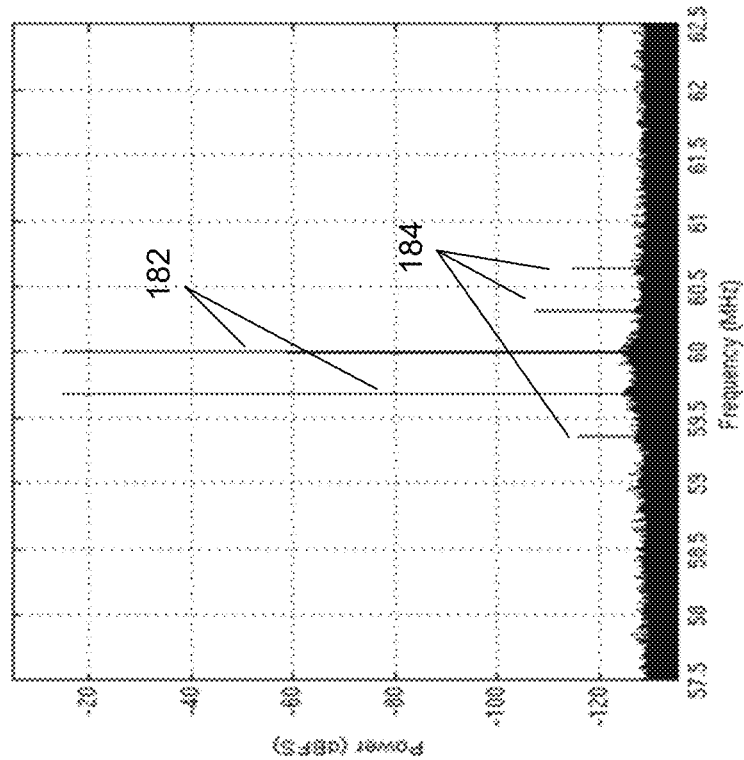

FIG. 10A and FIG. 10B show before and after frequency plots 180-1, 180-2 illustrating the application of an NLEQ technique to a two-tone ADC response 182 in order to remove those S/H spurs and intermods 184 which remain after the TVQ waveform attenuates the higher-order spurs. Because NLEQ models fit well the low-order S/H spurs and intermods 184, the NLEQ technique attenuates these lower-order nonlinear distortions to low levels. FIG. 10B shows the low-order S/H spurs and intermods 184 of FIG. 10A to be almost eliminated. The improvement in linearity can be greater than that shown with further refinement of the TVQ waveform injected prior to the application of the NLEQ technique and with fine-tuning of the NLEQ algorithms used.

Figure 11:
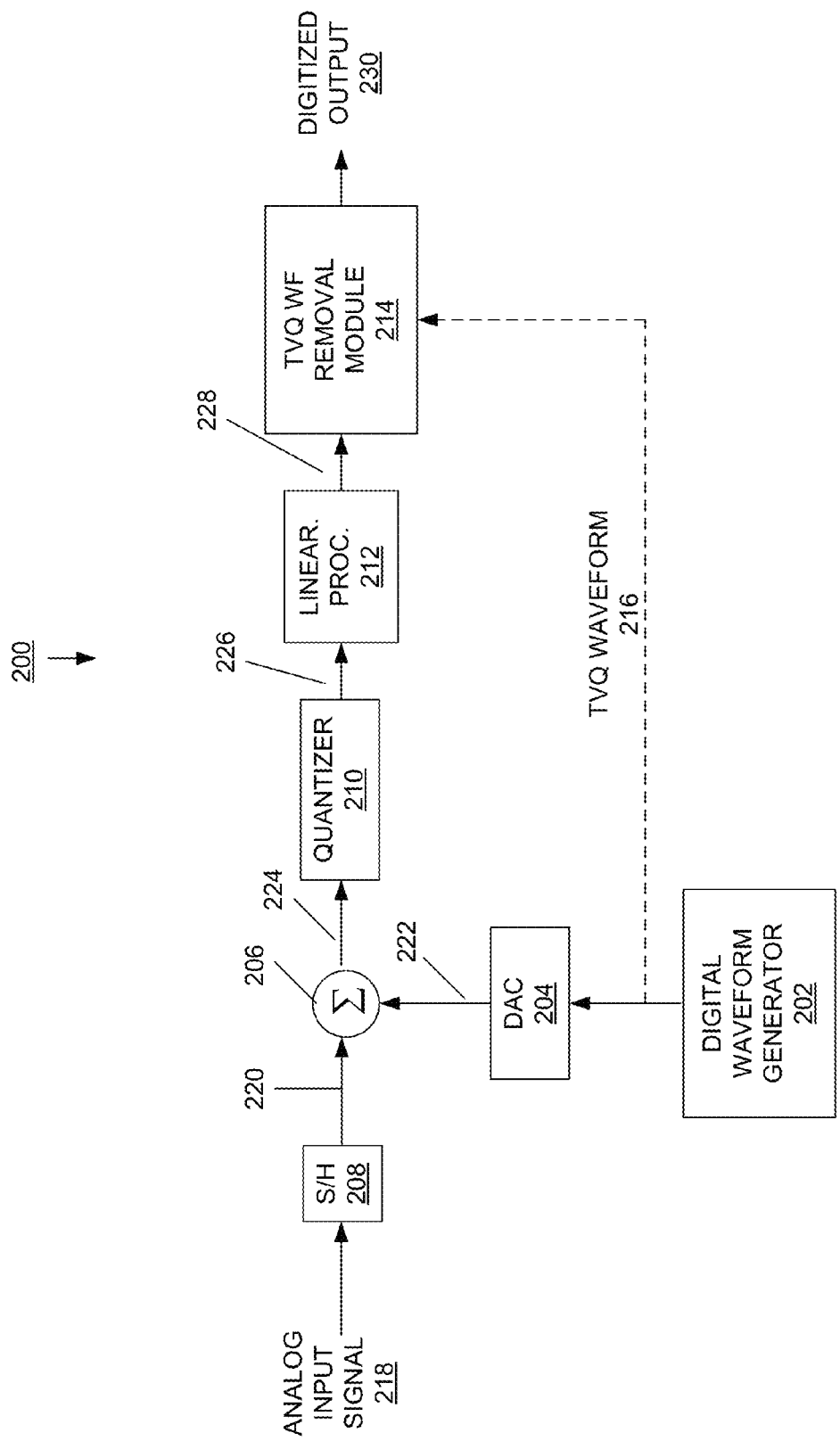
FIG. 11 is a block diagram of another embodiment of an ADC linearization system.

FIG. 11 shows another embodiment of a signal-linearization system 200 including a digital waveform generator 202 in communication with a DAC 204, a signal adder 206, S/H circuitry 208, quantizer circuitry 210, a linearizer processor 212, and a TVQ waveform removal module 214. This embodiment of signal-linearization system 200 is similar to the embodiment of signal-linearization system 100 of FIG. 5, with one difference being that the high-level TVQ waveform 216 is injected after the S/H circuitry 208 and before the quantizer circuitry 210, whereas in the signal-linearization system 100 of FIG. 5, a high-level TVQ waveform 114 is injected before the ADC 102 (and thus before the S/H circuitry of the ADC).

In this signal-linearization system 200, the S/H circuitry 208 receives the analog input signal 218 of interest, and samples and holds the input signal in time. The signal adder 206 is in communication with the S/H circuitry 208 to receive the acquired samples 220. The waveform generator 202 produces the high-level, digital, TVQ waveform 216, and the DAC 204 receives and converts the digital TVQ waveform 216 into its analog TVQ counterpart 222. The signal adder 206 receives the analog TVQ counterpart 222 from the DAC 204 and combines it with the acquired samples 220 arriving from the S/H circuitry 208. The combined analog signal 224, having the dither, passes from the signal adder 206 to the quantizer circuitry 210. The quantizer circuitry 210 converts the combined analog signal 224 with the dither into an intermediate digitized signal 226.

The linearizer processor 212 receives and removes nonlinear distortions from the intermediate digitized signal 226 to produce an intermediate linearized digitized signal 228. The TVQ waveform removal module 214 receives the intermediate linearized digitized signal 228 from the linearizer processor 212 and removes the TVQ waveform 216. In one embodiment, the waveform generator 202 is in communication with the TVQ waveform removal module 214 to send thereto the TVQ waveform 216, for use in subtracting the TVQ waveform 216 from the intermediate linearized digitized signal 228. The resulting linearized digitized output 230 has attenuated S/H-generated and quantizer-generated spurs and intermods. The order of the linearizer processor 212 and TVQ waveform removal module 214 may be reversed in some embodiments.

To implement the signal-linearization system 200 of FIG. 11, a new design of ADC is provided, one consisting of the quantizer circuitry 210 without any S/H circuitry. This ADC receives the combined analog signal 224 from the signal adder 206. Alternatively, the S/H circuitry 208 can be deployed before a conventional ADC, with the S/H circuitry of the conventional ADC being bypassed so that the quantizer circuitry 210 of the conventional ADC receives the combined analog signal 224 directly from the signal adder 206. As in the signal-linearization system 100 of FIG. 5, the TVQ waveform 216 used in the signal-linearization system 200 is a high-level signal with a low peak-to-average ratio.

A possible advantage of this configuration over the signal-linearization system 100 of FIG. 5 is that the S/H circuitry 208 does not have to process the TVQ waveform 216. A tradeoff to injecting the TVQ waveform 216 after the S/H circuitry 208, however, is that the TVQ waveform 216 is unable to partially suppress any nonlinearities introduced by the S/H circuitry 208, as is done in the signal-linearization system 100 of FIG. 5.

When the maximum level of the analog input signal 218 is moderately high, the linearizer processor 212 may be omitted from the signal-linearization system 200 for some types of ADCs. This omission is possible because S/H-generated spurs and intermods tend to decrease as the level of the input signal is reduced, and for these lower input signal levels, the quantizer-generated spurs and intermods then tend to dominate. Therefore, when the linearity requirement is moderate, use of a high-level, low peak-to-average ratio TVQ waveform to lower the quantizer-generated spurs and intermods can provide a sufficiently high spur and intermod-free dynamic range (i.e., without having to use a linearizer processor 212 to remove S/H-generated nonlinear distortions).

In another embodiment, an NLEQ filter can be used instead a linearizer processor 212 to reduce the levels of low-order spurs and intermods generated by circuitry that precedes the quantizer circuitry 210, such as an RF amplifier or an RF receiver. In such an embodiment, the TVQ waveform 216 can still increase the overall spur and intermod-free dynamic range to a greater extent than would be achievable using the linearizer processor 212 alone because the TVQ waveform 216 operates to reduce the levels of quantizer-generated high-order spurs and intermods.

A tradeoff to using a high-level TVQ waveform is a reduction in the dynamic range of the input signal. For example, if the maximum TVQ waveform amplitude is approximately half as large as the maximum amplitude of the input signal, then the maximum level of the input signal needs to be reduced by approximately 3.5 dB (i.e., to avoid saturation of the ADC) when compared to the case when a TVQ waveform is not used. Therefore, while the SFDR/IFDR may improve by using a TVQ waveform, the maximum SNR decreases by 3.5 dB. To compensate for the decrease in SNR, one can choose to use an ADC that has a 3.5 dB higher SNR. However, such an ADC typically costs more and consumes more power than an ADC with a lesser SNR. In some cases, such an ADC may even be unavailable. Alternatively, multiple ADCs can be used to recover the lost SNR. An example implementation that uses multiple ADCs to increase SNR is described in U.S.

Pat. No. 6,653,959, granted Nov. 25, 2003, the entirety of which is incorporated by reference herein.

Figure 12:
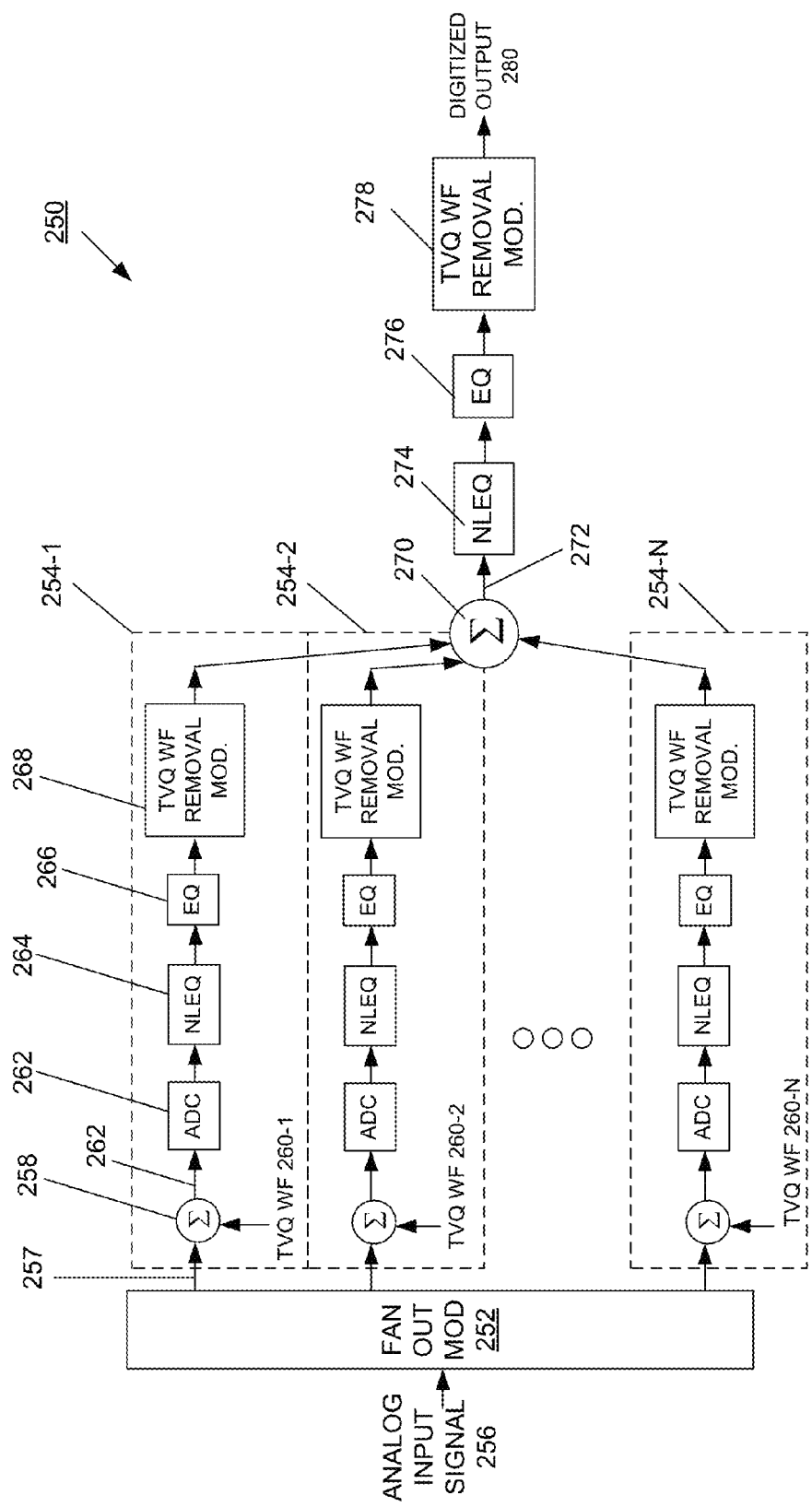
FIG. 12 is a block diagram of an embodiment of an ADC linearization system having multiple ADCs to enhance SNR.

FIG. 12 shows an embodiment of a multi-ADC linearization system 250 that can recover lost SNR or provide even higher SNR than achievable with a single ADC, while providing improved SFDR/IFDR. The multi-ADC linearization system 250 includes a fan-out module 252 in communication with a plurality of parallel signal-linearization subsystems 254-1, 254-2, 254-N (generally, 254). The fan-out module 252 receives the analog input signal 256 of interest and supplies a corresponding analog input signal 257 to each signal-linearization subsystem 254.

Each signal-linearization subsystem 254 includes a signal adder 258 that injects a TVQ waveform 260 (produced by a waveform generator and DAC, both not shown) into its received corresponding analog input signal 257, an ADC 262 that converts the dithered analog input signal to a digitized signal, a linearizer processor (NLEQ) 264 that primarily attenuates or removes low-order nonlinear distortions from the digitized signal, a linear equalizer (EQ) 266, and a TVQ waveform removal module 268 that removes the TVQ waveform from the equalized digitized signal.

An adder 270 receives and combines the outputs of the signal-linearization subsystems 254 to produce a combined digitized signal 272 with a higher SNR than can be produced by a single signal-linearization subsystem. Generally, a 3 dB increase in SNR occurs for each doubling of the number of ADCs because signals add coherently and noise adds in power. The combined digitized signal 272 passes to a linearizer processor (NLEQ) 274, for removing low-order nonlinear distortions, then to a linear equalizer (EQ) 276. The linear equalizer 276 equalizes frequency response and time delay of the channel and can compensate for gain and offset differences. Another TVQ waveform removal module 278 can remove the TVQ waveform from the combined digitized signal 272.

In different embodiments of a multi-ADC linearization system, certain instances of the linearizer processors 264, 274, linear equalizers 266, 276, and TVQ waveform removal modules 268, 278 are optional. For example, an embodiment having a minimum configuration includes the one NLEQ 274 and the one TVQ waveform removal module 278 for the combined digitized signal 272; that is, the NLEQ 264 and TVQ waveform removal module 268 in each signal-linearization subsystem 254 are omitted because the NLEQ 274 for the combined digitized signal 272 can, in many instances, linearize combined nonlinearities. When the combined nonlinearities are too complex for the one NLEQ 274, each signal-linearization subsystem 254 can have its own NLEQ 264.

In addition, for high fidelity applications, each signal-linearization subsystem 254 preferably has an EQ 266 because of the difficulty aligning ADC inputs and clocks and matching gain and phase across frequencies. In such embodiments, the EQ 276 for the combined digitized signal 272 is optional.

Further, whether the TVQ waveform removal module 268 is required for each signal-linearization subsystem 254 depends on the types of TVQ waveforms used. For example, if an out-of-band TVQ waveform is used, the one TVQ waveform removal module 278 for the combined digitized signal 272 is preferred for purposes of minimizing computations (the other TVQ waveform removal modules 268 being optional). Alternatively, if the TVQ waveform is in-band and requires precise removal, then each signal-linearization subsystem 254 preferably has the TVQ waveform removal module 268. In addition, the order of the NLEQ, EQ, and TVQ waveform removal modules within each signal-linearization subsystem 254 and for processing the combined digitized signal, may be different, depending on the type of TVQ waveform used. In some embodiments, the NLEQ, EQ, and TVQ waveform removal modules may be configured to operate in parallel.

In addition, different and statistically independent TVQ waveforms 260 may be used for the multiple signal-linearization subsystems 254 when their ADC responses are closely matched, in order to make sure that proper SNR gain is maintained. Alternatively, in some embodiments there are sufficient differences among the ADCs 262, such as in gain, offset, frequency response, integral nonlinearity, differential nonlinearity, and clock/signal alignment, to enable using the same TVQ waveform for all signal-linearization subsystems 254 and thereby reduce the cost of the waveform generators (not shown).

A multi-ADC linearization system configuration can also be implemented in phased array receiver systems, with one difference being that the analog input signal arriving at each signal-linearization subsystem comes from a different antenna rather than from a fan-out module.

When multiple ADCs are used in time-interlaced fashion to provide higher sampling rate than can be achieved by a single ADC, the group of time-interlaced ADCs can be treated as a single ADC for purposes of applying the techniques described herein.

Figure 13:
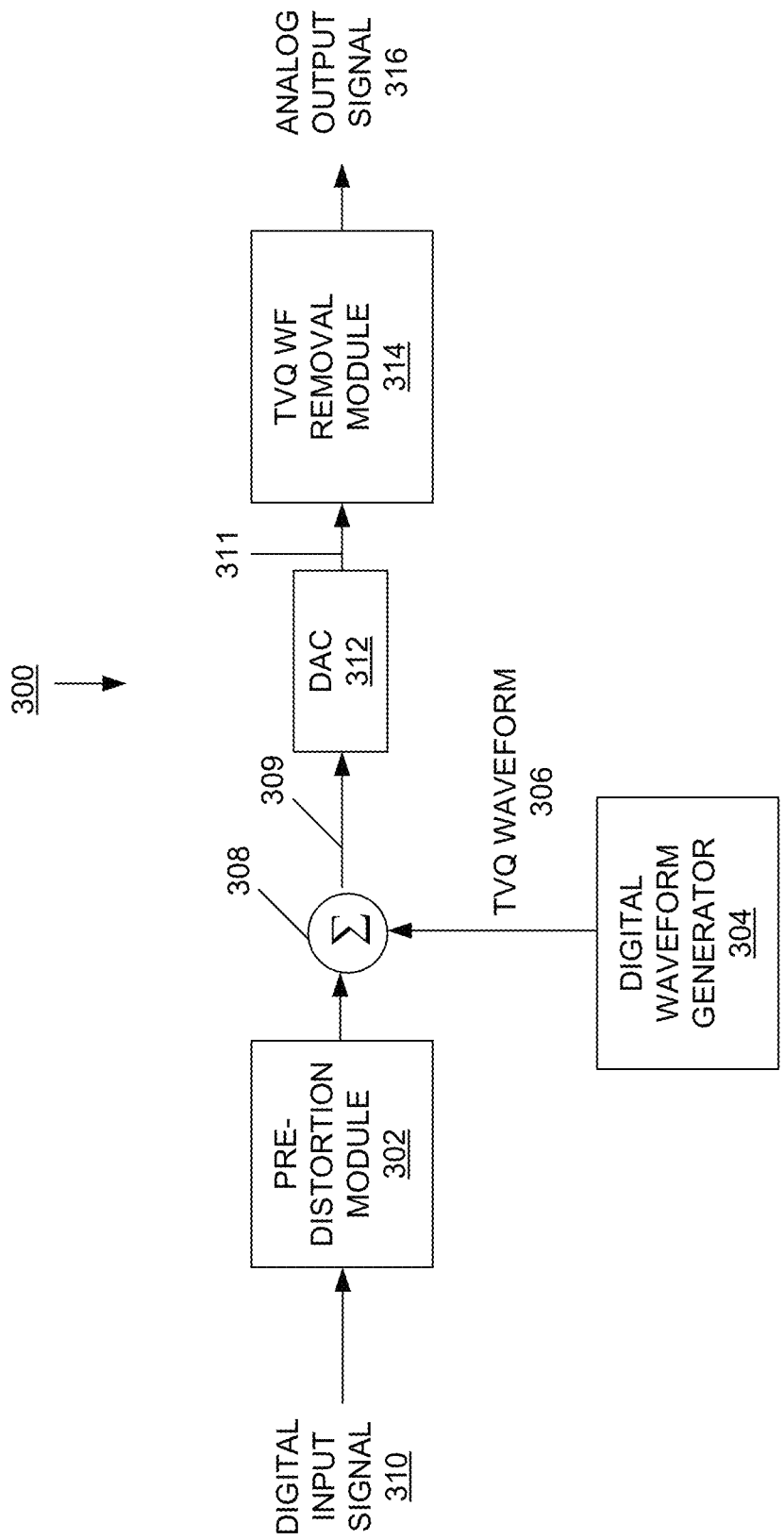
FIG. 13 is an embodiment of a DAC (Digital-to-Analog Converter) linearization system.

FIG. 13 shows an embodiment of a signal-linearization system 300 adapted to reduce quantizer-generated spurs and intermods of a DAC. The signal-linearization system 300 includes a pre-distortion module 302, a waveform generator 304 for producing a high-level, low peak-to-average ratio digital TVQ waveform 306, a signal adder 308 for combining the TVQ waveform 306 and the digital input signal 310 of interest, a DAC 312 for converting the combined digital signal 309 into a DAC analog output signal 311, and a TVQ waveform removal module 314 for subtracting the TVQ waveform 306 from the DAC analog output signal 311 to produce a linearized analog output signal 316. If an out-of-band TVQ waveform is used, the TVQ waveform removal module 314 is implemented with an analog filter. If nonlinearities appear in the analog output signal 316, such as those nonlinearities that can be caused by an output amplifier, the pre-distortion module 302 can distort the digital input signal 310 to linearize further the appearance of the analog output signal 316. Because the pre-distortion techniques generally do not work well for DAC spurs and intermods, the injected TVQ waveform operates to reduce these spurs and intermods.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects. All such forms may be generally referred to herein as a "system." Furthermore, aspects of the present invention may take the form of a computer program product embodied in one or more computer readable storage medium(s) having computer readable program code embodied thereon.

A computer readable storage medium may be any tangible medium that can contain, or store a program for use by or in connection with an instruction execution system, apparatus, or device. A computer readable storage medium may be, for example, but not limited to, an electronic, magnetic, optical, electromagnetic, infrared, or semiconductor system, apparatus, or device, or any suitable combination of the foregoing. More specific examples of the computer readable storage medium include, but are not limited to, the following: a portable computer diskette, a hard disk, a random access memory (RAM), a read-only memory (ROM), an erasable programmable read-only memory (EEPROM, EPROM, Flash memory), an optical fiber, a portable compact disc read-only memory (CD-ROM), an optical storage device, a magnetic storage device, or any suitable combination of the foregoing. Program code embodied on a computer readable storage medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages.

Aspects of the present invention are described herein with reference to flowchart illustrations and block diagrams of methods, apparatus (systems), and computer program products in accordance with embodiments of the invention. Each block of the flowchart illustrations and block diagrams, and combinations of blocks in the flowchart illustrations and block diagrams can be implemented by computer program instructions.

Computer program instructions may be provided to a processor of a general purpose computer, special purpose computer, or other programmable data processing apparatus to produce a machine, such that the instructions, which execute via the processor of the computer or other programmable data processing apparatus, create means for implementing the functions, acts, or operations specified in the flowchart and block diagram block. Computer program instructions may also be stored in a computer readable storage medium that can direct a computer, other programmable data processing apparatus, or other devices to function in a particular manner, such that the instructions stored in the computer readable medium produce an article of manufacture including instructions which implement the function, act, or operation specified in the flowchart and block diagram block.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions, acts, or operations specified in the flowchart or diagram block.

The flowchart and block diagrams in the FIGS. illustrate the architecture, functionality, and operation of possible implementations of systems, methods, and computer program products according to various embodiments of the present invention. In this regard, each block in the flowchart or block diagrams may represent a module, segment, or portion of program code, which comprises one or more executable instructions for implementing the specified logical function(s). The functions noted in the blocks may occur out of the order noted in the FIGS. For example, two blocks shown in succession may be executed substantially concurrently, or the blocks may sometimes be executed in the reverse order, depending upon the functionality involved. In addition, each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

While the invention has been shown and described with reference to specific preferred embodiments, it should be understood by those skilled in the art that various changes in form and detail may be made therein without departing from the spirit and scope of the invention as defined by the following claims.

What is claimed is:

1. A method of reducing nonlinear distortions in a digitized signal generated by an analog-to-digital converter (ADC) when converting an analog input signal from analog to digital form, the method comprising:
adding, to the analog input signal, a dither waveform adapted to suppress nonlinear distortions attributed to quantizer circuitry of the ADC during conversion of the analog input signal into a digitized signal, the dither waveform being substantially uncorrelated with the analog input signal and having a signal level that is approximately equal to or greater than a maximum signal level of the analog input signal;
performing nonlinear equalization (NLEQ) on the digitized signal to suppress nonlinear distortions attributed to sample-and-hold (S/H) circuitry of the ADC during the conversion of the analog input signal into the digitized signal; and
removing, from the digitized signal, a digital counterpart of the dither waveform added to the analog input signal.

2. The method of claim 1, wherein the dither waveform has a substantially uniformly distributed frequency spectrum in a predetermined frequency range, a peak-to-average ratio approximately equal to the square root of two, and a substantially balanced distribution of quantization levels.

3. The method of claim 1, wherein the signal level of the dither waveform is within approximately 1 to 6 dB of the maximum signal level of the analog input signal.

4. The method of claim 1, wherein a sum of the signal levels of the dither waveform and the analog input signal is near a saturation level of the ADC.

5. The method of claim 2, wherein the frequency spectrum of the dither waveform is out-of-band with respect to the analog input signal.

6. The method of claim 2, wherein the frequency spectrum of the dither waveform is designed to avoid producing nonlinear artifacts in a narrowband about the digitized signal.

7. The method of claim 1, wherein the dither waveform is an up-down chirp signal with a random chirp rate.

8. The method of claim 1, wherein removing the dither waveform from the digitized signal occurs before performing the NLEQ on the digitized signal.

9. The method of claim 1, wherein the dither waveform is added to the analog input signal after the analog input signal passes through the sample-and-hold circuitry of the ADC and before samples acquired by the sample-and-hold circuitry pass to the quantizer circuitry of the ADC.

10. The method of claim 1, further comprising increasing signal-to-noise ratio (SNR) of the digitized signal by:
fanning out the analog input signal to multiple ADCs operating in parallel such that each ADC receives a corresponding analog input signal;
adding a dither waveform to the corresponding analog input signal received by each ADC, the dither waveform added to the corresponding analog input signal received by that ADC being adapted to suppress nonlinear distortions attributed to quantizer circuitry of that ADC during conversion of the corresponding analog input signal received by that ADC into an intermediate digitized signal; and combining the intermediate digitized signals produced by the multiple ADCs to produce the digitized signal.

11. The method of claim 10, further comprising performing nonlinear equalization (NLEQ) on each of the intermediate digitized signals to suppress nonlinear distortions attributed to sample-and-hold (S/H) circuitry of the ADC producing that intermediate digitized signal.

12. The method of claim 10, further comprising removing, from each intermediate digitized signal, a digital counterpart of the dither waveform added to each corresponding analog input signal before combining the intermediate digitized signals to produce the digitized signal.

13. The method of claim 1, wherein the nonlinear distortions attributed to the quantizer circuitry of the ADC includes digital feedback effects.

14. A signal-linearization system for reducing nonlinear distortions in a digitized signal generated by an analog-to-digital converter (ADC) when converting an analog input signal from analog to digital form, the system comprising:

a signal adder adding a dither waveform to the analog input signal, the dither waveform being substantially uncorrelated with the analog input signal and having a signal level that is approximately equal to or greater than a maximum signal level of the analog input signal;

an ADC including sample-and-hold (S/H) circuitry and quantizer circuitry, the ADC converting the analog input signal with the added dither waveform into a digitized signal, the dither waveform operating to suppress nonlinear distortions attributed to the quantizer circuitry;

a linearizer processor performing nonlinear equalization (NLEQ) on the digitized signal to suppress nonlinear distortions attributed to the S/H circuitry; and a dither waveform removal module removing a digital counterpart of the dither waveform from the digitized signal.

15. The system of claim 14, wherein the dither waveform has a substantially uniformly distributed frequency spectrum in a predetermined frequency range, a peak-to-average ratio approximately equal to the square root of two, and a substantially balanced distribution of quantization levels.

16. The system of claim 14, wherein the signal level of the dither waveform is within approximately 1 to 6 dB of the maximum signal level of the analog input signal.

17. The system of claim 14, wherein a sum of the signal levels of the dither waveform and the analog input signal is near a saturation level of the ADC.

18. The system of claim 15, wherein the frequency spectrum of the dither waveform is out-of-band with respect to the analog input signal.

19. The system of claim 15, wherein the frequency spectrum of the dither waveform is designed to avoid producing nonlinear artifacts in a narrowband about the digitized signal.

20. The system of claim 14, wherein the dither waveform is an up-down chirp signal with a random chirp rate.

21. The system of claim 14, wherein the dither waveform removal module is disposed between the ADC and the linearizer processor in order to remove the dither waveform from the digitized signal before the linearizer processor performs nonlinear equalization on the digitized signal.

22. The system of claim 14, wherein the dither waveform is added to the analog input signal after the analog input signal passes through the sample-and-hold circuitry and before samples acquired by the sample-and-hold circuitry pass to the quantizer circuitry.

23. The system of claim 14, wherein the nonlinear distortions attributed to the quantizer circuitry of the ADC includes digital feedback effects.

24. A signal-linearization system for reducing nonlinear distortions in a digitized signal generated by an analog-to-digital converter (ADC) when converting an analog input signal from analog to digital form, the system comprising:

means for providing an analog input signal to each ADC of a plurality of ADCs operating in parallel;

a plurality of analog signal adders, each signal adder being in communication with one of the ADCs, each signal adder combining a dither waveform to the analog input signal provided to the ADC with which that signal adder is in communication, each dither waveform added to one of the analog input signals being adapted to suppress nonlinear distortions attributed to quantizer circuitry of the ADC receiving that analog input signal, each dither waveform being substantially uncorrelated with that one analog input signal to which that dither waveform is added, and each dither waveform having a signal level that is approximately equal to or greater than a maximum signal level of that one analog input signal to which that dither waveform is added; and a digital signal adder receiving and combining the intermediate digitized signals produced by the plurality of ADCs to produce a digitized signal.

25. The system of claim 24, further comprising a plurality of linearizer processors, each linearizer processor performing nonlinear equalization on one of the intermediate digitized signals to suppress nonlinear distortions attributed to the sample-and-hold (S/H) circuitry of the ADC producing that intermediate digitized signal.

26. The system of claim 24, further comprising a plurality of dither waveform removal modules each removing, from one of the intermediate digitized signals, the dither waveform added to the corresponding analog input signal from which that intermediate digitized signal is generated before the digital signal adder combines the intermediate digitized signals to produce the digitized signal.

27. The system of claim 24, wherein the means for providing an analog input signal to each ADC of the plurality of ADCs includes a fan-out module in communication with each of the signal adders.

28. The system of claim 24, wherein the means for providing an analog input signal to each ADC of the plurality of ADCs includes an antenna in communication with an RF receiver.

29. The system of claim 24, further comprising:

a linearizer processor performing nonlinear equalization on the digitized signal to suppress nonlinear distortions attributed to S/H circuitry of the ADCs; and a dither waveform removal module removing, from the digitized signal, a digital counterpart of each dither waveform.

30. A signal-linearization system for reducing nonlinear distortions in an output signal generated by a signal converter device when converting an input signal between analog and digital forms, the system comprising:

a signal adder adding a dither waveform to the input signal;

a signal converter device converting the input signal with the added dither waveform from one of the analog and digital forms into an output signal having the other of the analog and digital forms, the dither waveform being adapted to suppress nonlinear distortions by being substantially uncorrelated with the input signal and by having a signal level that is approximately equal to or greater than a maximum signal level of the input signal, a frequency spectrum that is substantially uniformly distributed within a predetermined frequency range, a peak-to-average ratio that is approximately equal to the square root of two, and a distribution of quantization levels that is substantially balanced; and a dither waveform removal module removing the dither waveform from the output signal.

31. A signal-linearization system for reducing nonlinear distortions in an analog output signal by a digital-to-analog converter (DAC) when converting a digital input signal from digital to analog form, the system comprising:

a waveform generator producing a digital dither waveform, the digital dither waveform being substantially uncorrelated with the digital input signal and having a signal level that is approximately equal to or greater than a maximum signal level of the digital input signal;

a digital signal adder adding the digital dither waveform to the digital input signal;

a DAC converting the digital input signal with the added digital dither waveform into an analog output signal, the digital dither waveform operating to suppress nonlinear distortions attributed to circuitry of the DAC; and a dither waveform removal module in communication with the DAC to receive the analog output signal, the dither waveform removal module removing from the analog output signal an analog counterpart of the digital dither waveform and producing a linearized analog output signal.

32. The method of claim 1, wherein the dither waveform comprises a combination of a sinusoidal waveform with time-varying frequencies.

33. The method of claim 1, wherein the dither waveform comprises a triangular sinusoidal signal.

34. The system of claim 14, wherein the dither waveform comprises a combination of one or more sinusoidal waveforms with time-varying frequencies.

35. The system of claim 14, wherein the dither waveform comprises a triangular sinusoidal signal.

* * * * *